United States Patent [19]

Miyamoto

[11] Patent Number: 5,367,485
[45] Date of Patent: Nov. 22, 1994

[54] SEMICONDUCTOR MEMORY DEVICE INCLUDING OUTPUT LATCHES FOR IMPROVED MERGING OF OUTPUT DATA

[75] Inventor: Takayuki Miyamoto, Hyogo, Japan

[73] Assignee: Mitsubishi Denki Kabushiki Kaisha, Tokyo, Japan

[21] Appl. No.: 711,571

[22] Filed: Jun. 3, 1991

Related U.S. Application Data

[63] Continuation of Ser. No. 545,668, Jun. 20, 1990, abandoned, which is a continuation of Ser. No. 249,903, Sep. 27, 1988, abandoned.

[30] Foreign Application Priority Data

Sep. 29, 1987 [JP]  Japan .................. 62-247611

[51] Int. Cl.$^5$ .............................................. G11C 7/00
[52] U.S. Cl. ........................... 365/189.05; 365/230.03
[58] Field of Search ............... 365/189.05, 230.03, 365/230.04, 205, 189.01; 307/475, 530

[56] References Cited

U.S. PATENT DOCUMENTS

| 4,044,330 | 8/1977 | Johnson et al. | 365/189.05 |
|---|---|---|---|
| 4,075,606 | 2/1978 | Wilkens | 365/189.05 |
| 4,583,204 | 4/1986 | Takemge et al. | 365/189.05 |
| 4,612,631 | 9/1986 | Ochii | 365/189.05 |
| 4,831,590 | 5/1989 | Ichinose | 365/189.05 |
| 4,908,796 | 3/1990 | Lee et al. | 365/189.05 |

FOREIGN PATENT DOCUMENTS 0012663  6/1980  European Pat. Off. ........ 365/230.03

OTHER PUBLICATIONS

IEEE J. of Sol. St. Circuits: "A Fast 256K×4 CMOS DRAM with a Distributed Sense and Unique Restore Circuit" by H. Miyamoto et al., vol. SC-22, No. 5, Oct. 1987, pp. 861–6.

IEEE J. of Sol. St. Circuits: "A Reliable 1-Mbit DRAM with a Multi-Bit-Test Mode", by M. Kumanoya et al., vol. SC-20, No. 5, Oct. 1985, pp. 909–913.

Mosaid Incorporated: "An Analysis of the Toshiba TC511000/TC511001 CMOS 1Mx1 DRAMs", Aug., 1986.

*Primary Examiner*—Glenn Gossage
*Attorney, Agent, or Firm*—Lowe, Price, LeBlanc & Becker

[57] ABSTRACT

A plurality of devices or memories, preferably dynamic random access memories (DRAMs), are used with their output terminals connected together, and the devices or DRAMs output data signals successively in response to externally applied output enable signals. A latch circuit is provided at the output terminal of each device or DRAM. The latch circuits hold not only the output signal of the DRAM to which it belongs but also the commonly connected output signal of another DRAM in response thereto. Consequently, the output signal from any one DRAM is held by the latch circuits until an output signal is provided from another DRAM. Thus, an accurate common output signal can be obtained without being affected by external noise or the requirement for extremely accurate timing signals.

10 Claims, 6 Drawing Sheets

5,367,485

SEMICONDUCTOR MEMORY DEVICE INCLUDING OUTPUT LATCHES FOR IMPROVED MERGING OF OUTPUT DATA

This application is a continuation application of application Ser. No. 07/545,668, filed Jun. 20, 1990, now abandoned, which is a continuation application of application Ser. No. 07/249,903, filed Sep. 27, 1988, also now abandoned.

BACKGROUND OF THE INVENTION

1. Field of the Invention

The present invention generally relates to semiconductor integrated circuit devices and particularly to a semiconductor integrated circuit device, used in a manner in which output terminals of at least two such devices are connected together. The invention has particular applicability to semiconductor memories such as dynamic random access memories.

2. Description of the Prior Art

In recent years, semiconductor memories have been frequently utilized for image processing. Particularly, in the technical fields of image processing, a plurality of semiconductor memories are used for image processing and data stored in the memories are required to be output at high speed.

FIG. 1 is a conceptional diagram showing a conventional image processing system including a plurality of semiconductor memories. Referring to FIG. 1, this image processing system comprises a plurality of memory devices 20a to 20c for image processing, a digital-to-analogue (D/A) converting portion 42 for converting data signals from the memory devices 20a to 20c to analogue signals, a display portion 43 for displaying an image based on the analogue signals, and a control portion 41. The memory devices 20a to 20c are connected to receive output control signals $\overline{OEa}$ to $\overline{OEc}$, respectively, from the control portion 41 and respective outputs thereof are connected together to an input of the D/A converting portion 42.

In operation, the memory devices 20a to 20c successively output successively signals stored therein in response to the signals $\overline{OEa}$ to $\overline{OEc}$, respectively, supplied from the control portion 41. The output signals are converted to analogue signals by the D/A converting portion 42 and supplied to the display portion 43.

FIG. 2 is a block diagram showing an example of a conventional dynamic random access memory (referred to hereinafter as DRAM). This DRAM is applicable to a memory device shown in FIG. 1.

The DRAM such as shown in FIG. 2 is disclosed in "A Reliable 1-M Bit DRAM with a Multi-Bit-Test Mode" by M. Kumanoya et al., 1985 (IEEE Journal Solid-State Circuits, vol. SC-20, pp. 909–913) and also in "A Fast 256K×4 CMOS DRAM with a Distributed Sense and Unique Restore Circuits" by Ho Miyamoto et al., 1987 (IEEE Journal Solid-State Circuits, vol. SC-22, pp. 861–867).

Referring to FIG. 2, this DRAM comprises: a memory cell array 25 for storing data signals, a row and column address buffer 21 for receiving externally applied address signals A0 to A9 for selecting a memory cell, a row decoder 22 and a column decoder 23 for designating a memory cell by decoding the address signals A0 to A9, a sense refresh amplifier 24 for amplifying the signal stored in the designated memory cell, a data-in buffer 26 and a data-out buffer 27 for input and output of data, and a clock generator 10 for generating clock signals $\Phi 1$ and $\Phi 2$. The clock generator 10 is connected to receive a row address strobe signal $\overline{RAS}$ and a column address strobe signal $\overline{CAS}$, applied externally. A preamplifier 29 is provided between the sense refresh amplifier 24 and the data-out buffer 27. The data-out buffer 27 is connected to receive an output enable signal $\overline{OEa}$ applied externally through a terminal 10a receiving the output enable signal.

In operation, the data signal stored in the memory cell designated by the address signals is read out by the sense refresh amplifier 24 and then supplied to the data-out buffer 27 through the preamplifier 29. The data-out buffer 27 outputs the data signal in response to the signal $\overline{OEa}$ and the clock signal from the clock generator 10.

FIG. 3 is a circuit diagram showing data-out buffers in the respective DRAMs as shown in FIG. 2. A circuit similar to the data-out buffer circuit shown in FIG. 3 is indicated, for example in an analysis report of 1986 on 1M DRAM published by MOSAID-INC. Referring to FIG. 3, DRAMs 20a to 20c have output terminals connected together as shown in FIG. 1. The DRAMs 20a to 20c comprise data-out buffers 27a to 27c, respectively, which are identical tri-state buffers. For example, the data-out buffer 27a comprises NOR gates 3a and 4a each having two inputs, N channel enhancement type MOS transistors 1a and 2a connected in series between a power supply Vcc (+5 volts) and the ground Vss (0 volt), and an inverter 5a. The NOR gates 3a and 4a are connected to receive the output enable signal $\overline{OEa}$ through respective inputs on one side thereof. The NOR gate 4a is connected to receive, at the other input thereof, a signal Sai from the preamplifier 29, while the NOR gate 3a is connected to receive, at the other input thereof, the signal Sai from the preamplifier 29 through the inverter 5a. Outputs of the NOR gates 3a and 4a are connected to respective gates of the transistors 1a and 2a. The other data-out buffers 27b to 27c also have the same circuit configuration.

In operation, for example, if the signal $\overline{OEa}$ of low level is applied to the data-out buffer 27a of the DRAM 20a, the NOR gates 3a and 4a invert the signals applied to the respective other inputs thereof and output the inverted signals. More specifically, the NOR gate 3a supplies the data signal Sai from the preamplifier 29 to the gate of the transistor 1a through the inverter 5a because the above-mentioned other input of the NOR gate 3a is connected to the inverter 5a, while the NOR gate 4a supplies the inverted data signal Sai to the gate of the transistor 2a. Consequently, when the signal Sai is at high level, the transistor 1a is turned on and the transistor 2a is turned off, whereby a signal Sao of high level is output. When the signal Sai is at low level, the transistor 1a is turned off and the transistor 2a is turned on, whereby the signal Sao of low level is output.

On the other hand, if the signal $\overline{OEa}$ of high level is applied to the data-out buffer 27a, both the NOR gates 3a and 4a output signals of low level irrespective of the level of the signal Sai. Consequently, the transistors 1a and 2a are both turned off and the output terminal 9a is brought into a high-impedance state, that is, a floating state.

FIGS. 4A and 4B are timing charts for explaining operation of the DRAMs 20a and 20b, the output terminals of which are connected together. As described previously, when the DRAMs are applied to an image processing system, the output terminals of the DRAM 20a to 20c are connected together. The DRAM 20a to 20c successively output data signals stored therein, in response to the output enable signals $\overline{OEa}$ to $\overline{OEc}$ applied thereto, respectively. However, if timing of application of the signals $\overline{OEa}$ to $\overline{OEc}$ is not suitably controlled, the following disadvantages are brought about.

FIG. 4A shows a case in which data signals Sao and Sbo from two DRAMs 20a and 20b are output simultaneously in a certain period. This phenomenon occurs when the output enable signals $\overline{OEa}$ and $\overline{OEb}$ are simultaneously at a low level. More specifically, the DRAM 20a outputs data D1 in response to the signal $\overline{OEa}$ of low level. On the other hand, the DRAM 20B outputs data D2 in response to the signal $\overline{OEb}$. The data D1 is first provided (in a period t1) and then the data D2 is provided as a common output signal SO (in a period t3) from a node where the respective output terminals of the two DRAMs are connected together. However, as can be seen from the figure, there exists a period (t2) in which the data D1 and D2 are output simultaneously. In this period t2, an accurate common output signal So cannot be obtained. In addition, if the data D1 and D2 as provided by turn-on of the transistors 1a and 2b in FIG. 3, for example, are output in the period t2, a large penetration current flows from the power supply Vcc of the DRAM 20a to the ground Vss of the DRAM 20b through the terminals 9a and 9b. As a result, consumption of electric power is increased.

FIG. 4B shows a case in which the data signals Sao and Sbo from the two DRAMs 20a and 20b are output with a long time interval. This means that the output enable signals $\overline{OEa}$ and $\overline{OEb}$ of low level are supplied with a long time interval therebetween. Consequently, as can be seen from the figure, there exists a long period (t2')in which neither the data D1 nor the data D2 is output. In this period, the output terminals 9a and 9b of the two DRAMs 20a and 20b are both in the floating state as described above and, accordingly, the common output signal So is likely to be affected by external noise. Therefore, an accurate common output signal So cannot be obtained in this period t4.

As described above, although it is necessary to apply the output enable signals with optimally controlled timing to the DRAMs having the output terminals connected together, the timing control is difficult and an accurate common output signal So cannot be obtained.

SUMMARY OF THE INVENTION

An object of the present invention is to obtain an accurate output signal from at least two semiconductor integrated circuit devices having respective outputs connected together.

Another object of the present invention is to obtain an accurate output signal from at least two semiconductor memories having respective outputs connected together.

Still another object of the present invention is to prevent a common output signal from at least two semiconductor memories having respective outputs connected together from being affected by external noise.

A further object of the present invention is to prevent at least two semiconductor memories having their outputs connected together from simultaneously providing output signals.

A further object of the present invention is to prevent flow of a large electric current between a power supply and the ground through the respective outputs of at least two semiconductor memories having their outputs connected together.

A further object of the present invention is to obtain an accurate output signal from at least two DRAMs having their outputs connected together.

A further object of the present invention is to prevent a common output signal from at least two DRAMs having their outputs connected together from being affected by external noise.

A further object of the present invention is to prevent at least two semiconductor memories having their outputs connected together from simultaneously providing output signals.

A further object of the present invention is to provide flow of a large electric current between a power supply and the ground through the respective outputs of at least two DRAMs having their outputs connected together.

Briefly stated, a semiconductor integrated circuit device according to the present invention comprises: a circuit for applying a data signal, a buffer circuit for applying the data signal from the above-mentioned circuit to an output terminal of the device in response to an externally applied output control signal, and a latch circuit connected to the output terminal and responsive to the signal applied from the buffer circuit to hold the signal and to apply it to the output terminal. Plural semiconductor integrated circuit devices according to the present invention are used. At least two semiconductor integrated circuit devices according to the present invention are used, having their output terminals connected together. The latch circuit of each of the two devices is also responsive to the signal from the buffer circuit of the other device and holds the signal and supplies it to the output terminal connected thereto. Accordingly, the signal from the buffer circuit of one device is held by the two latch circuits and supplied to the common output terminal. Subsequently, the signal provided from the buffer circuit of the other device is also held by the two latch circuits. Since the signal from either buffer circuit is held by those two latch circuits in a period from output of the signal from one buffer circuit until output of the signal from the other buffer circuit, the signal can be prevented from being affected by external noise. In addition, a time duration of the output control signal applied externally is shortened because the latch circuits are provided. Accordingly, simultaneous output of the signals from the two buffer circuits can be prevented. In the above described manner, an accurate common output signal is obtained.

In a preferred embodiment, the present invention is applied to semiconductor memories. Consequently, when at least two semiconductor memories having their output terminals connected together are used, an accurate common output signal is obtained.

In a variation of the preferred embodiment, the present invention is applied to DRAMs. Consequently, when at least two DRAMs having their output terminals connected together are used, an accurate common output signal is obtained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
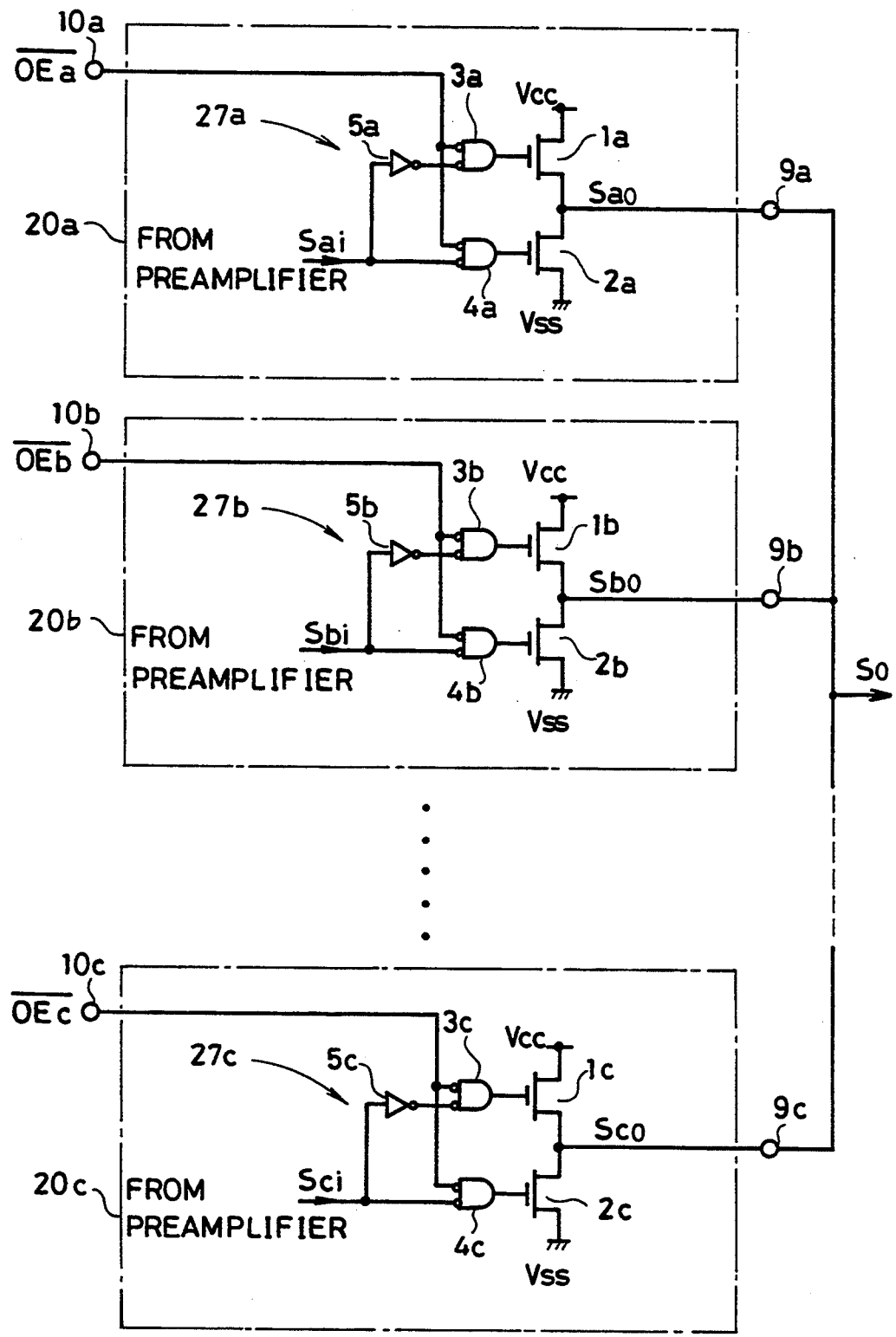
FIG. 3 is a circuit diagram showing data-out buffers of conventional DRAMs, the output terminals of which are connected together.
Figure 5:
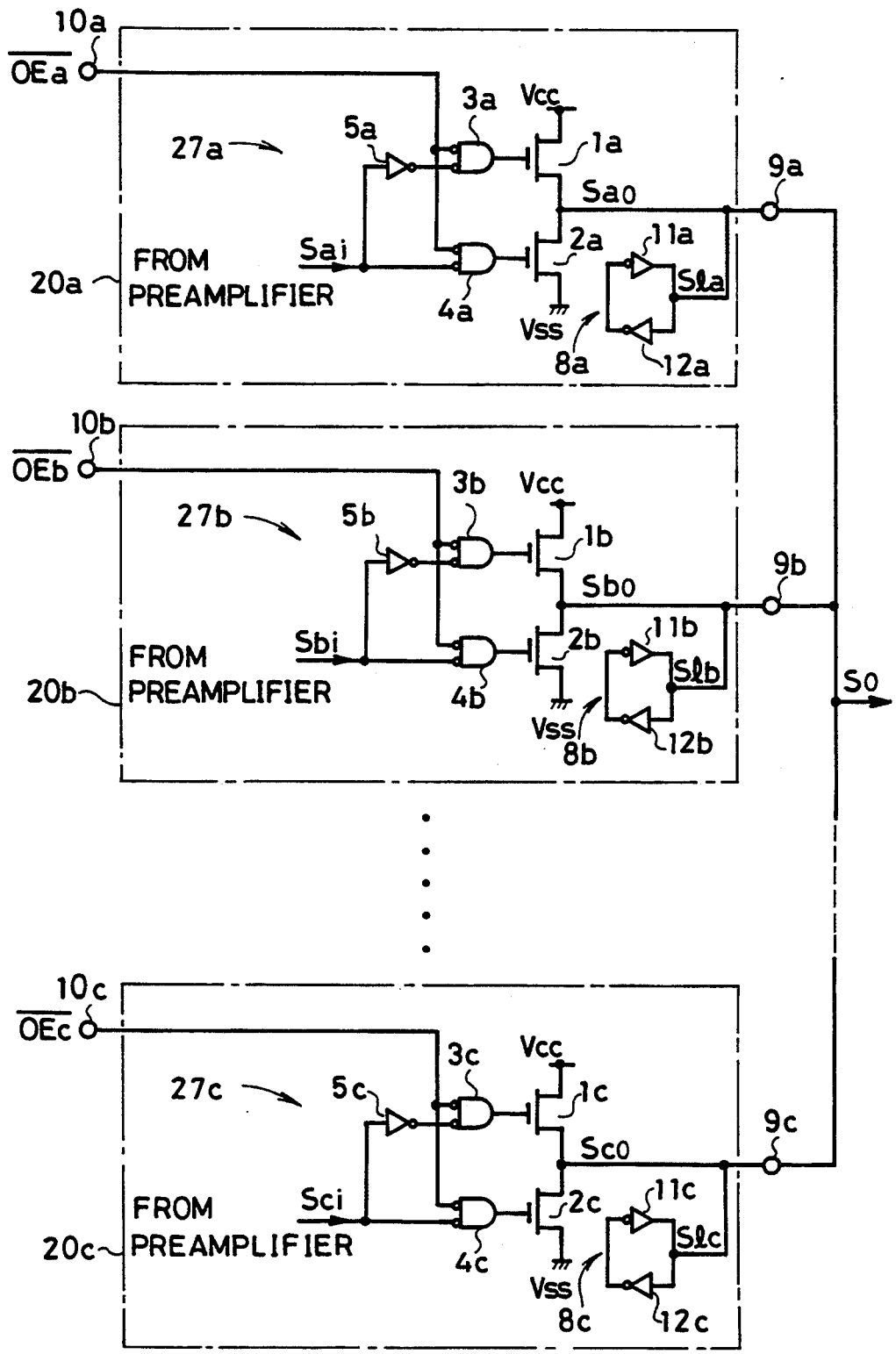
FIG. 5 is a circuit diagram showing data-out buffers of DRAMs according to an embodiment of the present invention, the output terminals of which are connected together.

FIG. 5 is a circuit diagram of data-out buffers in an embodiment of the present invention. Referring to FIG. 5, compared with the conventional case shown in FIG. 3, the data-out buffers further include latch circuits 8a to 8c connected to output terminals 9a to 9c, respectively. For example, the latch circuit 8a in the DRAM 20a includes two inverters 11a and 12a. An output of the inverter 11a, an input of the inverter 12a and the output terminal 9a are connected together, and an input of the inverter 11a and an output of the inverter 12a are connected together. The latch circuits 8b and 8c also have the same circuit configuration. Other circuit construction in this embodiment is the same as that of the conventional case shown in FIG. 3 and therefore a description thereof is omitted.

Figure 6:
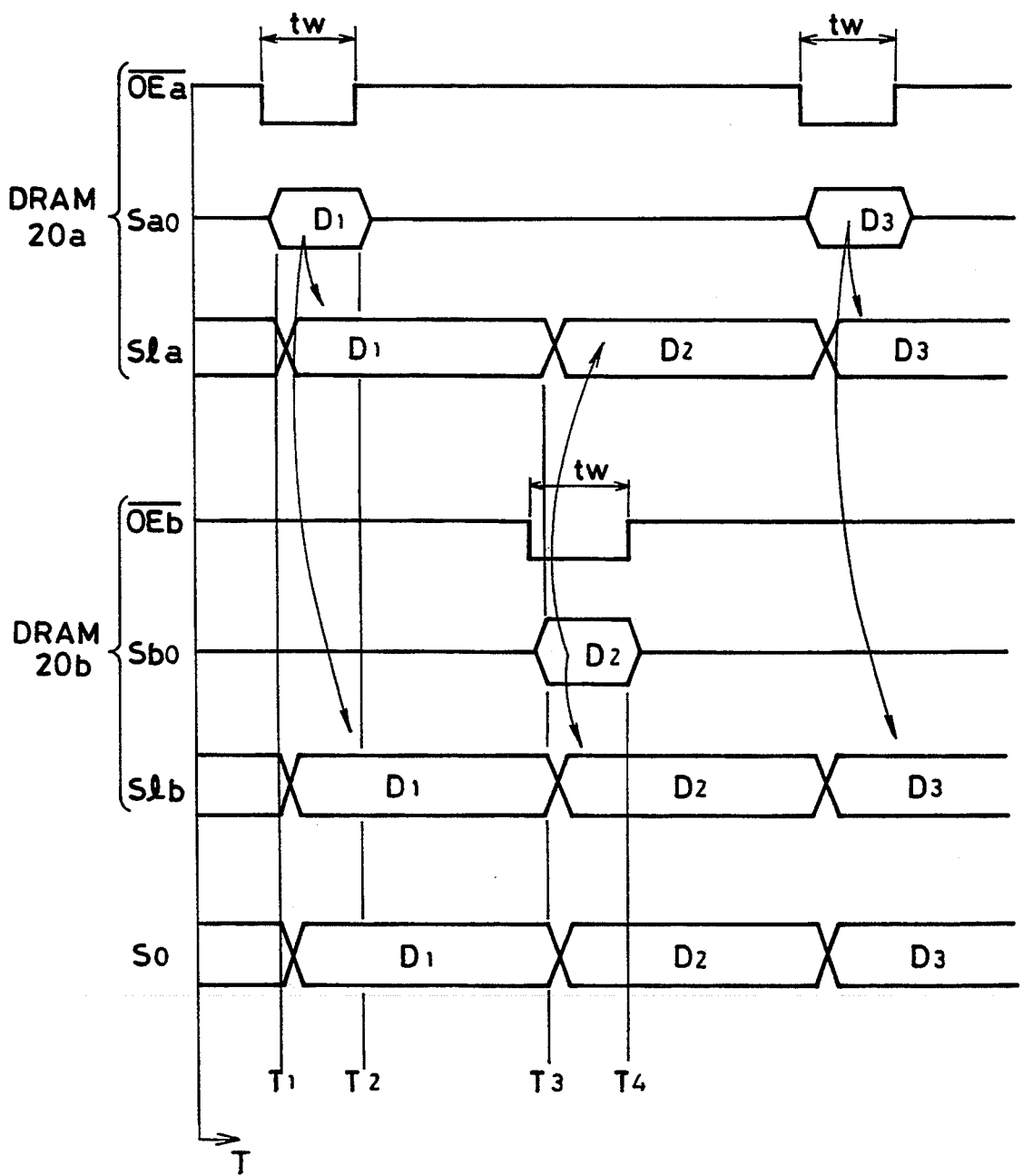
FIG. 6 is a timing chart for explaining operation of the two data-out buffers shown in FIG. 5.

FIG. 6 is a timing chart for explaining operation of the data-out buffers shown in FIG. 5. Referring to FIGS. 5 and 6, the operation will be described as follows.

First, an output enable signal $\overline{OEa}$ of low level is applied to the DRAM 20a. A data signal Sao representing data D1 for example is output from a connection point of transistors 1a and 2a (at time T1). The latch circuit 8a responds to the data signal Sao, so that a state of the latch circuit 8a is determined and the data D1 is held. Thus, a data signal s1a indicating the data D1 is output. On the other hand, the latch circuit 8b in the DRAM 20b also responds to the data signal Sao applied through the output terminals 9a and 9b, so that a state of the latch circuit 8b is determined and a data signal s1b indicating the data D1 is output. Accordingly, after the data D1 is output, since the common output signal So indicating the data D1 is maintained by the latch circuits 8a and 8b, the common output signal So indicating the data D1 is output (at time T2 to T3) even after the signal $\overline{OEa}$ has been raised to high level.

Then, the output enable signal $\overline{OEb}$ of low level is applied to the DRAM 20b. A data signal Sbo indicating data D2 is output from a connection point of transistors 1b and 2b (at time T3). The latch circuits 8b and 8a both hold the data D2 in response to the data signal Sbo as described above. Thus, a data signal s1b indicating the data D2 is output from both the DRAMs 20a and 20b. Accordingly, after the output enable signal $\overline{OEb}$ is applied to the DRAM 20b, the common output signal So indicating the data D2 is obtained. Since the data D2 is held by the latch circuits 8a and 8b, the common output signal So indicating the data D2 is output (at time T4 and thereafter) even after the signal $\overline{OEb}$ has been raised to high level.

Thus, the data signals are output successively from the DRAMs 20a and 20b having their output terminals connected together as described above. In the same manner, data signals are output successively from other DRAMs and the latch circuits 8a to 8c perform holding operation in response to the respective data signals. Consequently, even if the data signals Sao to Sco are output from the DRAMs 20a to 20c with long time intervals therebetween, the common output signal So can be prevented from being affected by external noise since the data signals Sao to Sco are held by the latch circuits 8a to 8c. Accordingly, an accurate common output signal So is obtained.

Figure 4A:
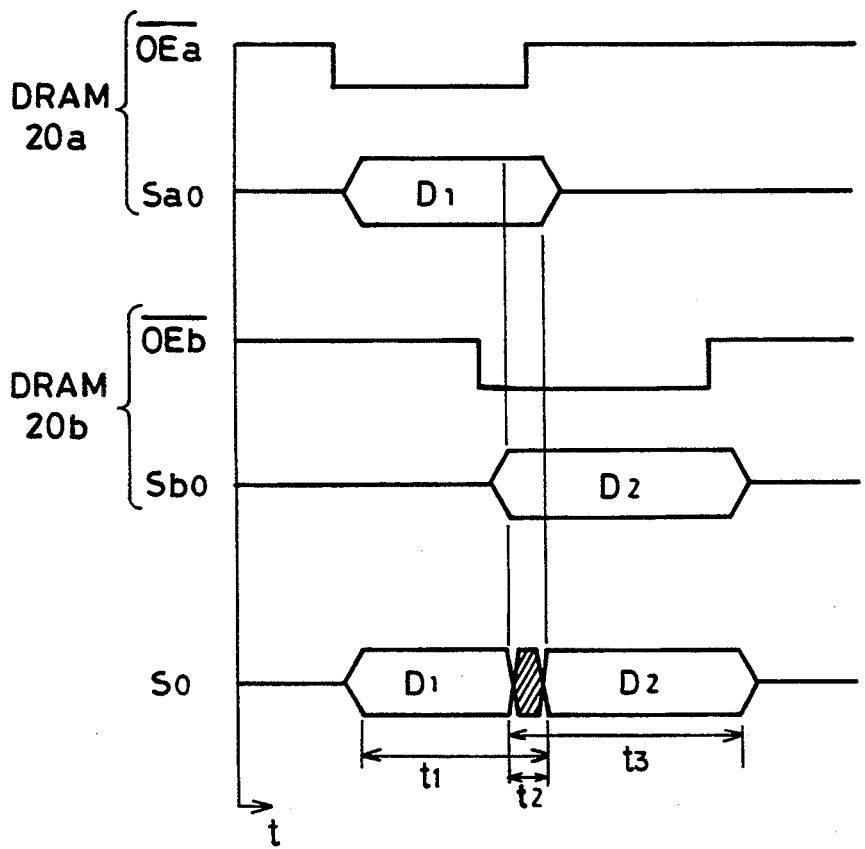
FIGS. 4A and 4B are timing charts for explaining the operation of the two data-out buffers shown in FIG. 3.
Figure 4B:
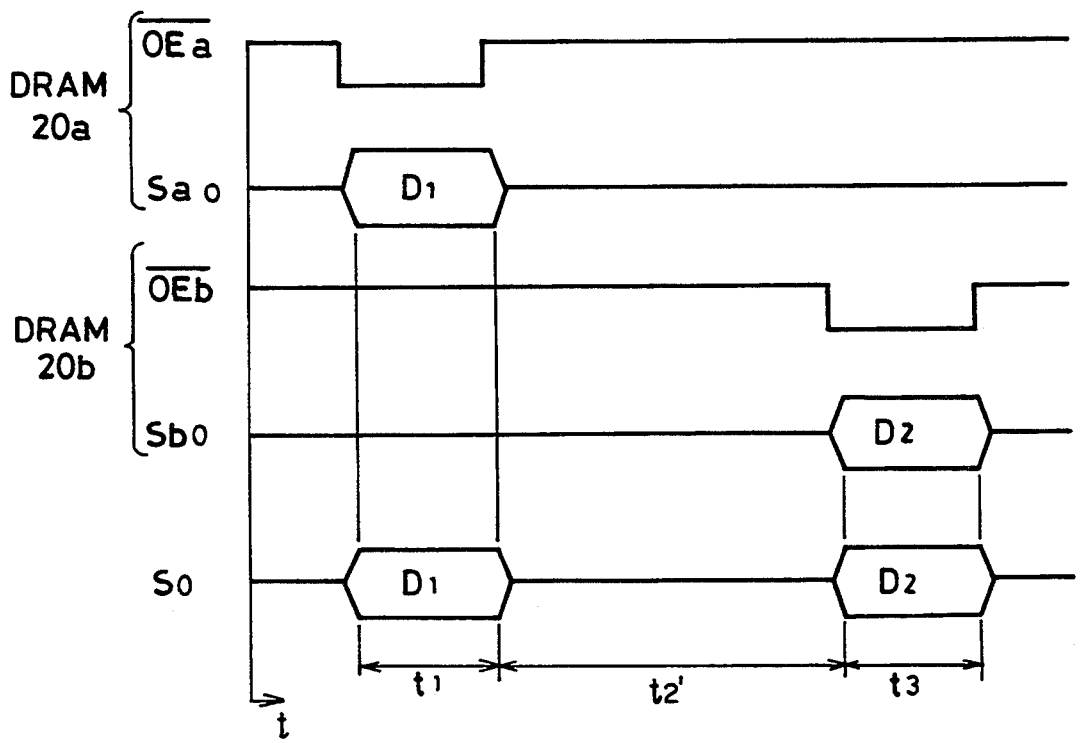

In addition, since the latch circuits 8a to 8c are provided, a pulse duration tw of the respective output enable signals $\overline{OEa}$ to $\overline{OEc}$ can be shortened compared with the conventional case. In other words, it is not needed to continuously output the data signals for a long period by increasing the pulse duration tw of the signals $\overline{OEa}$ to $\overline{OEc}$. The pulse duration tw may only have a duration necessary for changing the states of the latch circuits 8a to 8c. Thus, the short pulse duration tw of the signals $\overline{OEa}$ to $\overline{OEc}$ serves to prevent simultaneous output of plural data signals as shown in FIG. 4A. Consequently, an accurate common output signal So is obtained and flow of a large penetration current can be prevented.

Figure 1:
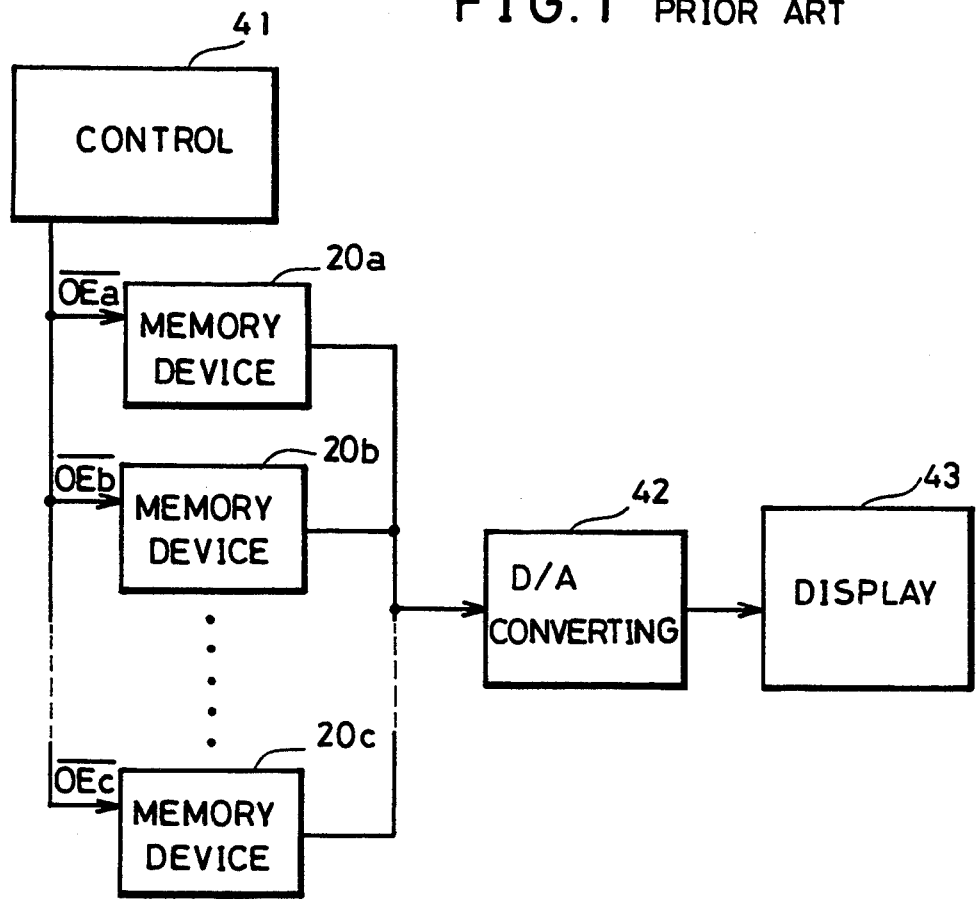
FIG. 1 is a conceptional diagram showing a conventional image processing system including a plurality of semiconductor memories.
Figure 7:
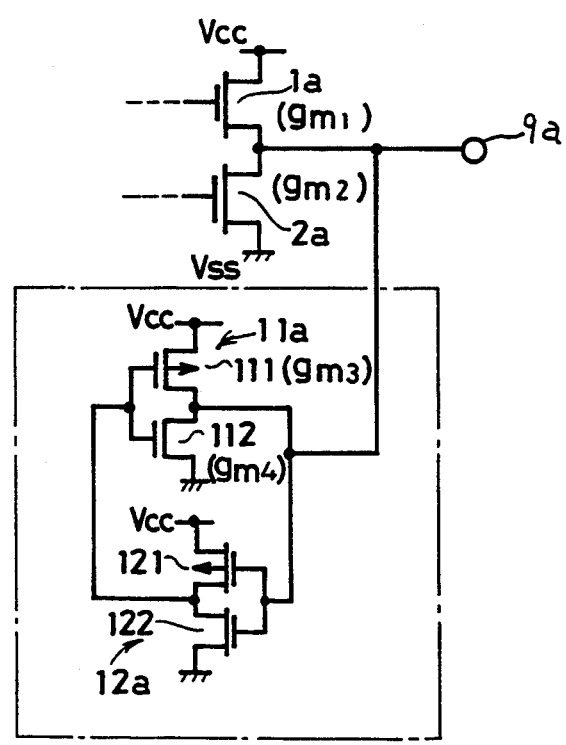
FIG. 7 is a circuit diagram showing an example of a latch circuit used in the data-out buffer shown in FIG. 5.
Figure 2:
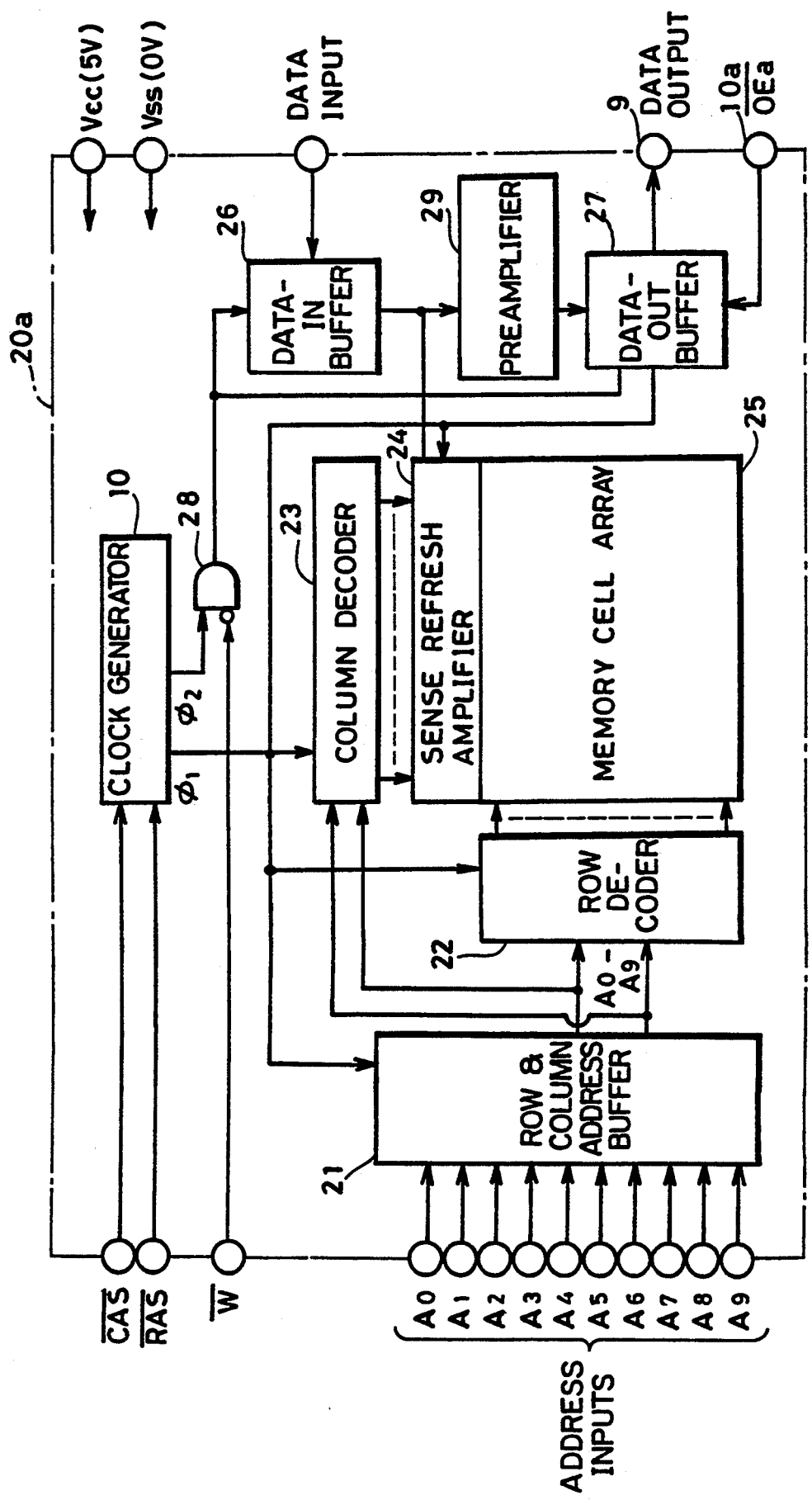
FIG. 2 is a block diagram showing an example of a conventional DRAM.

FIG. 7 is a circuit diagram showing an example of the latch circuit used in the data-out buffer shown in FIG. 5. Although only the latch circuit 8a is shown as an example in FIG. 7, the other latch circuits 8b and 8c have the same construction. Referring to FIG. 7, the inverter 11a comprises a CMOS inverter formed by a PMOS transistor 111 and an NMOS transistor 112, and a CMOS inverter formed by a PMOS transistor 121 and an NMOS transistor 122.

In order to perform, in the latch circuits 8a to 8c, the operation described in connection with FIG. 6, the below indicated circuit conditions are required. More specifically, as for the latch circuit 8a, assuming that mutual conductances of the transistors 1a, 2a, 111 and 112 are $g_{m1}$, $g_{m2}$, $g_{m3}$ and $g_{m4}$, the following conditions are required.

$$g_{m1} > g_{m4} \tag{1}$$

$$g_{m2} > g_{m3} \tag{2}$$

As is generally known, a mutual conductance is defined by a ratio of a voltage change between a gate and a source of an FET to a current change in its drain. Therefore, if the sizes of the transistors 1a, 2a, 111 and 112 are set to satisfy the inequalities (1) and (2), the operation in FIG. 6 can be performed.

Furthermore, the inverter 11a needs to satisfy conditions for supplying a predetermined output voltage. More specifically, Mitsubishi Data Book (on Memories) of 1988, for example prescribes current values and voltage values as below to be satisfied by output data signals of the DRAM.

TABLE 1

| | current value | voltage value |
| --- | --- | --- |
| output data signal "H" | $-2$ mA($I_{OH}$) | Min. 2.4 V($V_{OH}$) |
| output data signal "L" | 4.2 mA($I_{OL}$) | Max. 0.4 V($V_{OL}$) |

In order to output the data signal "H" (high level), the on resistance r3 $(=1/g_{m3})$ of the transistor 111 is as follows.

$$r3=(V_{cc}-V_{OH})/(-I_{OH}) \qquad (3)$$

Accordingly, assuming that the power supply voltage Vcc is 4.5V, the value of r3 should be set to about 1 KΩ.

In addition, in order to output the data signal "L" (low level), the on resistance r4 $(=1/g_{m4})$ of the transistor 112 is as follows.

$$r4=V_{OL}/I_{OL} \qquad (4)$$

Accordingly, the value of r4 should be set to about 100Ω.

On the other hand, the on resistance r1 $(=1/g_{m1})$ of the transistor 1a and the on resistance r2 $(=1/g_{m2})$ of the transistor 2a are set to about several hundreds of Ω or less and several tens of Ω or less, respectively.

As described in the foregoing, when at least two semiconductor integrated circuit devices according to the present invention are used with their output terminals being connected together, a data signal is always held in the latch circuits 8a to 8c and, accordingly, the common output signal So can be prevented from being affected by external noise. Furthermore, since the pulse duration of the output enable signals $\overline{OEa}$ to $\overline{OEc}$ can be shortened, and therefore simultaneous output of plural data signals can be prevented. As a result, the common output signal So can be prevented from being unstable and, in addition, flow of a large penetration current between the power supply Vcc and the ground Vss through the output terminals 9a to 9c can be prevented. Thus, an accurate common output signal is obtained without requiring complicated control procedures.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A semiconductor integrated circuit including a plurality of semiconductor integrated circuit devices and an output terminal,
   each of said plurality of semiconductor integrated circuit devices comprising:
   a) generating means for generating a data signal,
   b) receiving means for receiving an external output control signal,
   c) buffer means responsive to said generating means and to said receiving means for coupling said data signal to a buffer output terminal,
   d) latch means directly connected to said buffer output terminal for supplying to said buffer output terminal a data signal and for continuously holding a data signal applied to said buffer output terminal;
   and means for directly connecting together each buffer output terminal and the output terminal of the circuit, wherein the respective external output control signals are applied to their corresponding receiving means at a different timing sequence, each buffer means has a current drive ability larger than the current drive ability of the respective latch means and each latch means is responsive to a data signal coupled by the buffer means of each semiconductor integrated circuit device.

2. A semiconductor integrated circuit in accordance with claim 1, wherein each of said plurality of said semiconductor integrated circuit devices comprises a semiconductor memory device.

3. A semiconductor integrated circuit in accordance with claim 2, wherein each external output control signal comprises an output enable signal, and each receiving means includes a terminal for receiving a corresponding output enable signal.

4. A semiconductor integrated circuit in accordance with claim 2, wherein each generating means comprises at least one memory cell and sense amplifier means for amplifying a signal stored in said at least one memory cell.

5. A semiconductor integrated circuit in accordance with claim 4, wherein each buffer means comprises buffer means for operating in response to an external output control signal from a corresponding receiving means.

6. A semiconductor integrated circuit in accordance with claim 5, wherein each said latch means comprises:
   first inverter means for supplying a signal voltage to a respective buffer output terminal, and
   second inverter means for changing an output state of said first inverter means,
   an input terminal of said first inverter means and an output terminal of said second inverter means being connected together,
   an input of said second inverter means and an output of said first inverter means being connected together, and
   a connection point between the output of said first inverter means and the input of said second inverter means being connected to said respective buffer output terminal.

7. A semiconductor integrated circuit in accordance with claim 6, wherein each buffer means comprises:
   switching means connected to an output of a respective sense amplifier means, for transmitting the data signal from the respective sense amplifier means to a respective buffer output terminal in response to an external output control signal from a corresponding receiving means,
   a power supply,
   a reference potential source, and
   first and second field effect transistors connected in series between said power supply and said reference potential source,
   respective control electrodes of said first and second field effect transistors being connected to receive the transmitted data signal from said switching means, and
   a connection point of said first and second field effect transistors constituting an output of a respective buffer means.

8. A semiconductor integrated circuit in accordance with claim 7, wherein said first inverter means comprises third and fourth field effect transistors connected in series between said power supply and said reference potential source,
   respective control electrodes of said third and fourth field effect transistors being connected to an output of said second inverter means,
   a connection point of said third and fourth field effect transistors being connected to a respective buffer output terminal, a mutual conductance of said third field effect transistor being set to a value smaller than a mutual conductance of said second field effect transistor, and a mutual conductance of said fourth field effect transistor being set to a value smaller than a mutual conductance of said first field effect transistor.

9. A semiconductor integrated circuit in accordance with claim 8, wherein said first, second and fourth field effect transistors comprise field effect transistors of an N conductivity type, and said third field effect transistor comprises a field effect transistor of a P conductivity type.

10. A semiconductor integrated circuit in accordance with claim 8, wherein each said semiconductor memory device comprises a dynamic random access memory.

* * * * *